United States Patent [19]

Nishikawa et al.

[11] Patent Number: 5,679,976
[45] Date of Patent: Oct. 21, 1997

[54] MOLDED ELECTRIC PARTS AND METHOD OF MANUFACTURING THE SAME

[75] Inventors: Yoshiaki Nishikawa, Fujinomiya; Yasuyuki Takeda, Suita; Masanaga Kikuzawa, Ichikawa, all of Japan

[73] Assignee: Polyplastics Co., Ltd., Osaka, Japan

[21] Appl. No.: 367,191

[22] PCT Filed: Jun. 14, 1994

[86] PCT No.: PCT/JP94/00960

§ 371 Date: Jan. 13, 1995

§ 102(e) Date: Jan. 13, 1995

[87] PCT Pub. No.: WO94/29887

PCT Pub. Date: Dec. 22, 1994

[30] Foreign Application Priority Data

Jun. 14, 1993 [JP] Japan ................................. 5-142277
Dec. 28, 1993 [JP] Japan ................................. 5-337224

[51] Int. Cl.$^6$ ................. H01L 23/48; H01L 23/34; H01L 23/28
[52] U.S. Cl. ................. 267/690; 257/693; 257/713; 257/723; 257/787
[58] Field of Search .................... 257/690, 693, 257/708, 711, 713, 723, 724, 787, 734, 678, 778, 774, 679, 684, 687, 699, 781, 784, 786, 788, 789, 795; 437/180, 207, 224, 227, 230

[56] References Cited

U.S. PATENT DOCUMENTS 3,600,650  8/1971  Obenhaus ......................... 257/665

FOREIGN PATENT DOCUMENTS 0 436 907 A2  7/1991  European Pat. Off. ........... 257/787
55-140253  11/1980  Japan ............................... 257/678
62-92345  4/1987  Japan ............................... 257/787

OTHER PUBLICATIONS

Technical Notes; RCA; Hermatically Sealed Semiconductor "Flip–Chip" Assembly; Balents. Feb. 11, 1970.

Primary Examiner—Mahshid D. Saadat
Assistant Examiner—Jhihan B. Clark
Attorney, Agent, or Firm—Depaoli & Frenkel, P.C.

[57] ABSTRACT

The present invention provides a molded electric part which does not include any lead wires and is preferably compact in size and light in weight. The molded electric part of the invention can effectively prevent deterioration of an electric element by molding the element with a resin. The invention is also directed to a method of simultaneously manufacturing a number of products having fixed dimensions and excellent electrical properties through injection molding with a multi-forming mold complex. A molded film capacitor (1) of the invention includes a film capacitor element (2) and an element-receiving body (3) mainly composed of a synthetic resin with high dielectric ability. The film capacitor element (2) is accommodated in an element-receiving recess (7) formed in a substantial center of the element-receiving body (3). A couple of electrodes (2a,2a) formed on both side faces of the film capacitor element (2) are electrically connected with solder (5,5) to a film conductive pattern (4) formed by metal-plating a surface of the element-receiving body (3). Part of the conductive pattern (4) arranged on a bottom face of the element-receiving body (3) forms an outside connection terminal film (8). The film capacitor element (2) is further molded with a sealing resin (6) in an airtight manner for protecting the element-receiving recess (7) from outside humidity.

27 Claims, 5 Drawing Sheets

MOLDED ELECTRIC PARTS AND METHOD OF MANUFACTURING THE SAME

INDUSTRIAL FIELD

The present invention relates to molded electric parts prepared by molding active or passive elements, such as a transistor, a diode, a resistance, and a film capacitor, with a resin for simplified packaging. The invention also pertains to a method of manufacturing such molded electric parts.

PRIOR ART

In many cases, active and passive elements are formed to chips for circuit integration. Typical examples of such active and passive elements include 3-terminal surface-packaging, molded mini-transistors having short lead wires and molded film capacitors as illustrated in the perspective view of FIG. 8. With referring to FIG. 8, a film capacitor element 102 is electrically connected to metal lead frames 127,127 via wires 128,128 bonded with solder 129, and further molded with a resin 126, so that the film capacitor element 102 is protected from outside humidity.

Figures 8, 9A:
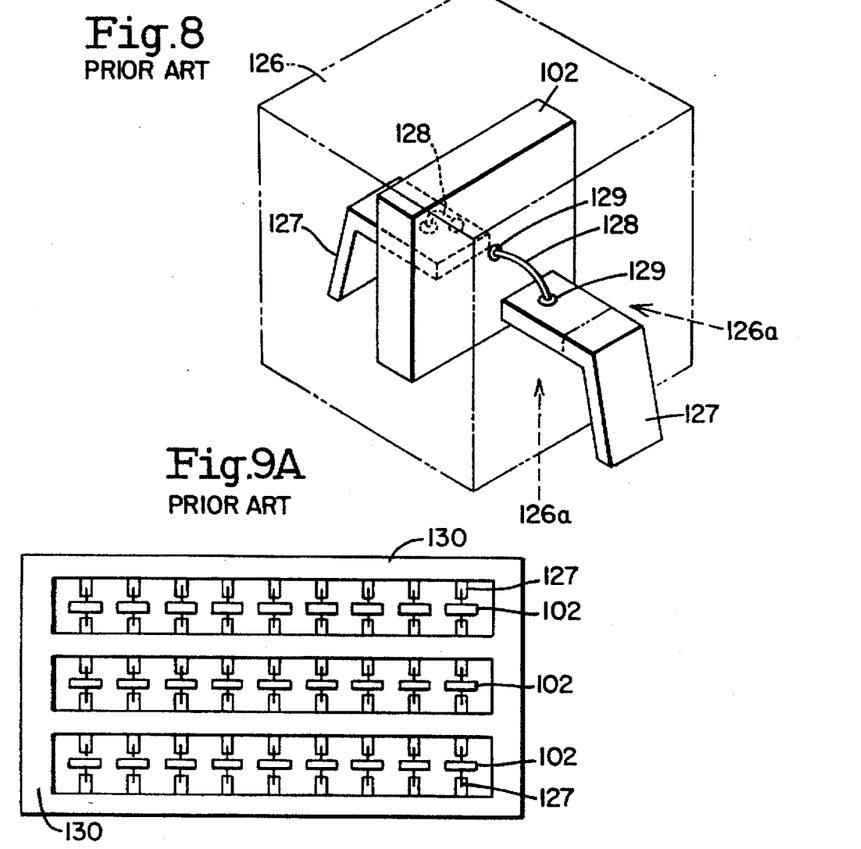
FIG. 8 is a perspective view illustrating a prior art film capacitor.
FIGS. 9A through 9C illustrate a step of manufacturing the prior art film capacitor FIG. 8.
Figure 9B:
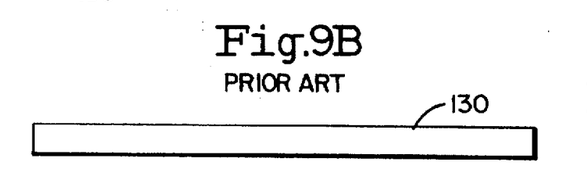

A method of manufacturing such a film capacitor is described according to FIGS. 9A through 9B.

Figure 9C:
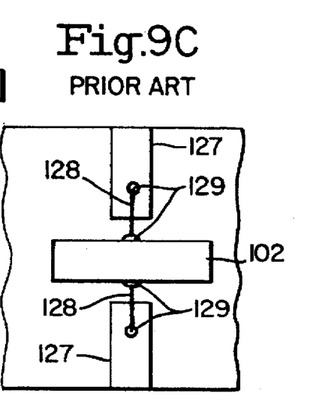

At a first step, a metal frame 130 including rows of lead frames 127,127, . . . ,127 is formed by blanking as illustrated in FIGS. 9A and 9B. A film capacitor element 102 is connected to each pair of lead frames 127 by a known wire-bonding method using wires 128 and solder 129 as shown in the enlarged view of FIG. 9C. Each film capacitor element 102 connecting with the pair of lead frames 127,127 is then molded with a resin and separated from the adjacent molded film capacitors.

Although prior-art electric parts formed to chips have shortened lead Wires or lead frames, the short lead wires or lead frames still protrude from the electric elements. This makes down-sizing and weight reduction of such electric parts rather difficult. Humidity sometimes invades a clearance (126a in FIG. 8) formed between the projected lead frame and the resin mold so as to deteriorate the electric element, generate an inductance due to twisting of lead wires, or even disconnect the lead wires. Apertures which the lead wires run through are to be formed on substrates such as printed circuit boards. Precise positioning of the lead wires with respect to the apertures is required in the process of packaging since the element chips have very narrow spaces between the lead wires.

The conventionally applied wire bonding method which solders each film capacitor element to a pair of lead frames via wires with a precision robot gives problems of an extremely low production efficiency and a high equipment cost. Other drawbacks include a variation in or scatter of the floating capacity between element electrodes due to a shift of the wire bonding position or the relative position of lead frames and recycle or treatment of massive metal wastes caused by blanking and cutting lead frames.

One object of the invention is thus to provide a molded electric part which does not include any lead wires and is preferably compact in size and light in weight.

Another object of the invention is to prevent deterioration of an electric element by molding the element with a resin.

Still another object of the invention is to simultaneously manufacture a number of products having fixed dimensions and excellent electrical properties through injection molding with a multi-forming mold complex.

DISCLOSURE OF THE INVENTION

The invention is directed to a molded electric part including: an element having an electrode; an element-receiving body primarily composed of a synthetic resin with high dielectric ability, the element-receiving body having an element-receiving recess formed in a predetermined site of the element-receiving body for accommodating the element therein; a conductive pattern formed by plating a surface of the element-receiving body; and an butside-connection terminal formed on at least one face of the element-receiving body, wherein the electrode of the element is electrically connected to the outside-connection terminal via the conductive pattern.

Examples of the molded electric part according to the invention include molded film capacitors, molded transistors, molded thermistors, molded thyristors, and molded resistors.

The invention is also directed to a method of manufacturing a molded electric part, which includes the steps of:

(a) pouring a synthetic resin having high dielectric ability into a multi-forming mold complex to simultaneously form a plurality of element-receiving bodies, each element-receiving body having an element-receiving recess for accommodating an element with an electrode;

(b) forming a conductive pattern by plating a predetermined surface of each element-receiving body with a metal;

(c) placing an element in the element-receiving recess of each element-receiving body; and (d) electrically connecting the electrode of each element with the conductive pattern.

According to one preferable application of the invention, the method further includes the steps of:

(e) molding each element with a sealing resin; and (f) separating the molded elements from one another by cutting.

The electrodes on the element are electrically connected to the outside connection terminal formed on at least one face of the element-receiving body via the conductive pattern formed on the surface of the electrode-receiving body. The at least one face of the element-receiving body is accordingly connectable electrically with a circuit structure on a substrate. This effectively solves all the problems of the conventional electric parts using lead wires. The structure of the invention does not require a working process for forming apertures for lead wires on the substrate. A little deviation of the electrical joint of the at least one face having the outside connection terminal with a connection face of the substrate from the center does not prevent the flow of electricity. The precise positioning is thus not required in the structure of the invention. The outside connection terminal may be set on an arbitrary face of the element-receiving body, which preferably allows any attaching orientation of the electric part.

The method of the invention simultaneously forms a plurality of element-receiving bodies by pouring a synthetic resin with high dielectric ability into a multi-forming mold complex, thereby favorably reducing the manufacturing cost. Injection molding ensures fixed dimensions of products, thus allowing the constant floating capacity and inductance for stable electrical properties.

BEST MODE FOR EMBODYING THE INVENTION

The above and other objects, features, aspects, and advantages of the invention will become more apparent from the detailed description of the preferred embodiments with accompanying drawings.

Figure 1:
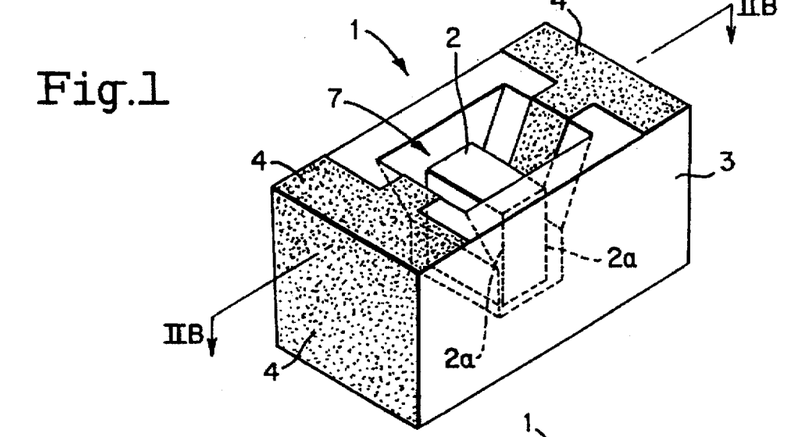
FIG. 1 is a perspective view illustrating a molded electric part as a first embodiment of the invention, which has a capacitor element received therein.
Figure 2A:
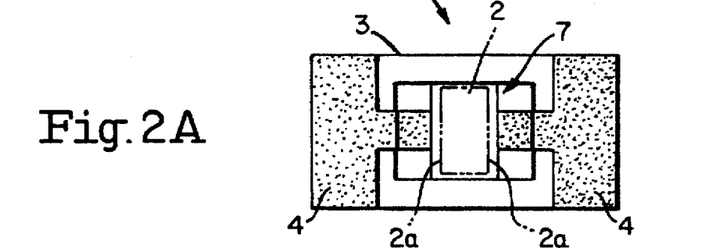
FIG. 2A is a plan view showing the molded electric part of FIG. 1.
Figure 2B:
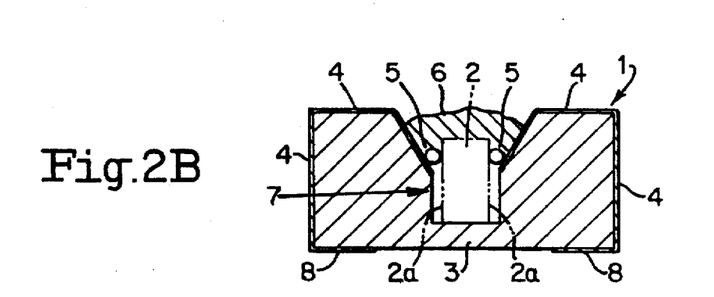
FIG. 2B is a cross sectional view taken on the line IIB—IIB of FIG. 1.
Figure 2C:
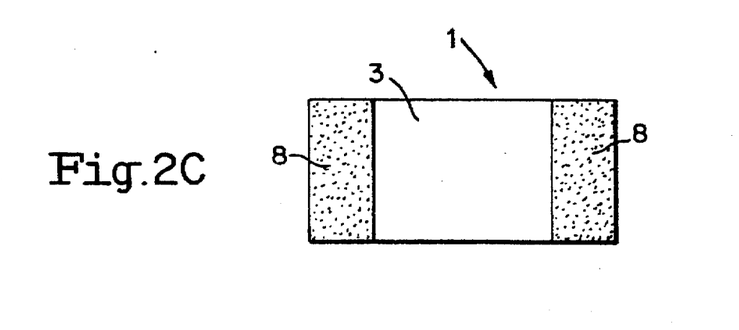
FIG. 2C is a bottom view showing the molded electric part of FIG. 1.

A molded film capacitor is described as a first embodiment according to the invention. FIG. 1 is a perspective view illustrating a molded electric part of the first embodiment of the invention, which has a film capacitor received therein as an exemplified 2-terminal element; FIG. 2A is a plan view showing the molded electric part of FIG. 1; FIG. 2B is a cross sectional view taken on the line IIB—IIB of FIG. 1; and FIG. 2C is a bottom view showing the molded electric part of FIG. 1.

The molded film capacitor 1 shown in FIG. 1 includes a film capacitor element 2 and an element-receiving body 3 mainly composed of a synthetic resin with high dielectric ability. As illustrated in FIG. 2B, the film capacitor element 2 is accommodated in an element-receiving recess 7 formed in a substantial center of the element-receiving body 3. A couple of electrodes 2a,2a formed on both side faces of the film capacitor element 2 are electrically connected with solder 5,5 to a film conductive pattern 4 formed by metal-plating a surface of the element-receiving body 3. Part of the conductive pattern 4 arranged on a bottom face of the element-receiving body 3 forms a film-shaped outside connection terminal 8. The film capacitor element 2 is molded with a sealing resin 6 in an airtight manner for protecting the element-receiving recess 7 from outside humidity.

In the molded film capacitor 1 of the first embodiment thus constructed, the film capacitor element 2 is electrically connected with a substrate not via lead frames but via the conductive pattern 4 formed on the surface of the element-receiving body 3. While the prior-art electric part has a problem of humidity invasion through a clearance between a resin mold and lead frames, the molded film capacitor 1 of the embodiment is free from such a problem and effectively prevents untimely deterioration of the film capacitor element. The molded film capacitor 1 is also free from any inductance due to distortion of lead frames or from disconnection of lead frames. In the packaging process, the outside connection terminal is in electrical contact at planes with a contact surface of a substrate. Unlike the point contact via lead frames, a little deviation from the center of the contact surface does not substantially affect the secure electrical contact. The molded film capacitor 1 of the embodiment is thus preferably applicable to surface mount technology (SMT), and has a reduced fraction defective compared with the prior-art electric part having a relatively high fraction defective due to inappropriate or incomplete connections. The structure of the embodiment without metal lead frames realizes down-sizing and weight reduction of the whole electric part.

Although the film capacitor element is held in the element-receiving body in the above embodiment, other 2-terminal elements including 2-terminal thyristors, such as a silicon symmetrical switch and a diode ac switch, 2-terminal diodes, 2-terminal filter elements, and 2-terminal resistor elements may be accommodated in the element-receiving body and molded with a sealing resin to form molded thyristors, molded diodes, molded filters, and molded resistors.

Figure 3A:
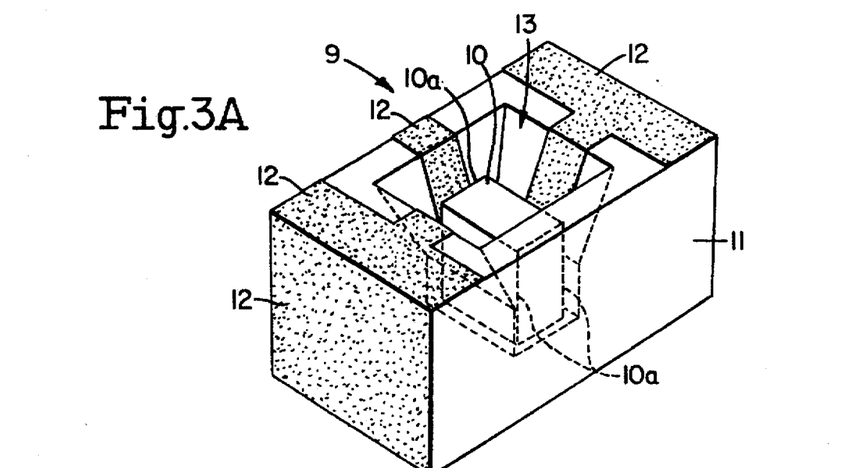
FIG. 3A is a perspective view illustrating a molded electric part as a second embodiment of the invention, which has a transistor element received therein.
Figures 3B, 4:
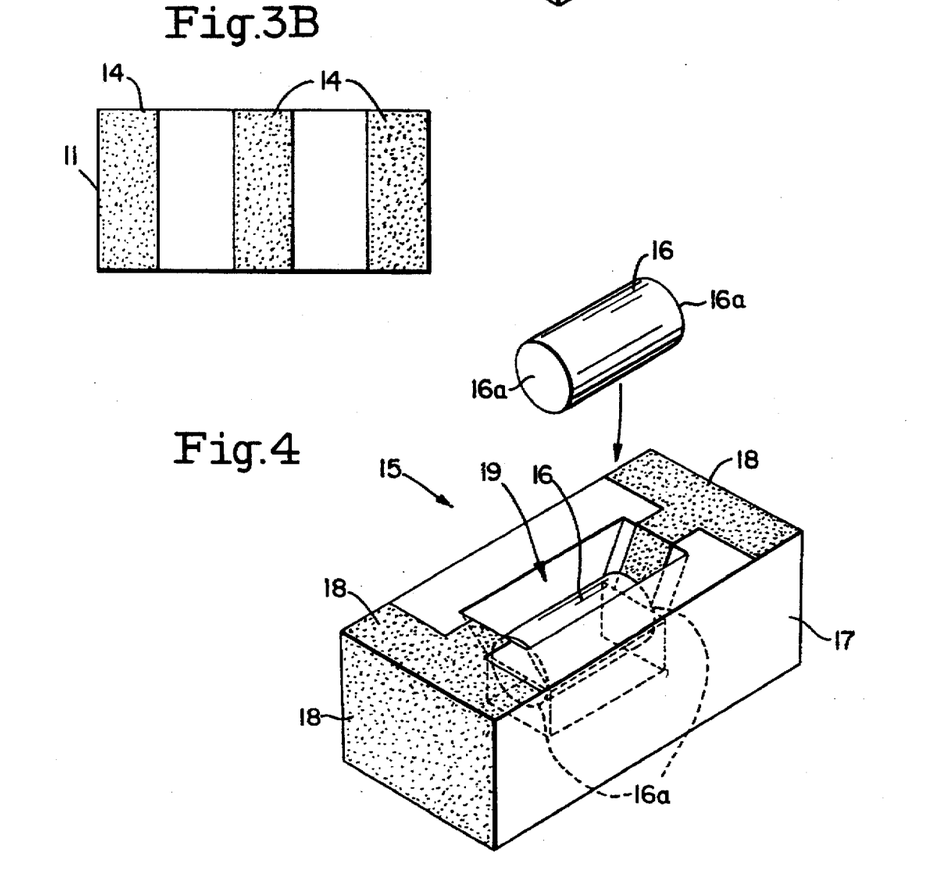
FIG. 3B is a bottom view showing the molded electric part of FIG. 3A.
FIG. 4 is a perspective view illustrating a molded electric part as a third embodiment of the invention, which has a cylindrical element received therein.

A molded transistor is explained as a second embodiment according to the invention. FIG. 3A is a perspective view illustrating a molded electric part of the second embodiment of the invention, which has a transistor element received therein as an exemplified 3-terminal element; and FIG. 3B is a bottom view showing the molded electric part of FIG. 3A. A molded transistor 9 shown in FIG. 9 includes a transistor element 10 and an element-receiving body 11. The transistor element 10 is accommodated in an element-receiving recess 13 formed in the element-receiving body 11. Three electrodes 10a formed on the transistor element 10 are electrically connected to a film conductive pattern 12 formed on the surface of the element-receiving body 11 by wire bonding technique or via solder as in the first embodiment. The transistor element 10 is also molded with a sealing resin (not shown), as in the film capacitor element of the first embodiment, in an airtight manner for protecting the element-receiving recess 13 from outside humidity. With referring to FIG. 3B, part of the conductive pattern 12 arranged on a bottom face of the element-receiving body 11 forms a film-shaped outside connection terminal.

The molded transistor 9 of the second embodiment thus constructed is under the airtight condition like the molded film capacitor of the first embodiment described above, thereby effectively preventing untimely deterioration of the transistor element due to invasion of humidity. The molded transistor 9 having the lead wire-free structure does not require an addition step of piercing through holes for lead wires in a substrate and is free from any inductance due to distortion of lead frames or from disconnection of lead frames.

In place of the transistor element, other 3-terminal elements including 3-terminal thyristors, such as an SCR and a triode ac switch, and 3-terminal FETs may be accommodated in the element-receiving body and molded with a sealing resin to form molded thyristors and molded FETs.

A molded resistor is explained as a third embodiment according to the invention. FIG. 4 is a perspective view illustrating a molded electric part of the third embodiment of the invention, which has a resistor element received therein as an exemplified 2-terminal cylindrical element. As illustrated in FIG. 4, a molded resistor 15 includes a resistor element 16 and an element-receiving body 17 having an element-receiving recess 19 formed therein for accommodating the resistor element 16. Two electrodes 16a,16a formed on the resistor element 16 are electrically connected to a film conductive pattern 18 formed on the surface of the element-receiving body 17 via solder. The resistor element 16 is also molded with a sealing resin (not shown), as in the film capacitor element of the first embodiment, in an airtight manner for protecting the element-receiving recess 19 from outside humidity. Part of the conductive pattern 18 arranged on a bottom face of the element-receiving body 17 forms a film-shaped outside connection terminal.

The molded resistor 15 of the third embodiment thus constructed is also free from untimely deterioration due to invasion of humidity and preferably applicable to surface mount technology.

In place of the resistor element, other cylindrical elements including varistors and capacitors may be accommodated in the element-receiving body and molded with a sealing resin to form molded varistors and molded capacitors. The shape of the accommodated element is not restricted to cylindrical, but elements of polygonal prisms such as quadratic prisms and hexagonal prisms may also be applicable. The shape of the element-receiving recess is changeable corresponding to the shape of the accommodated element.

Figure 5:
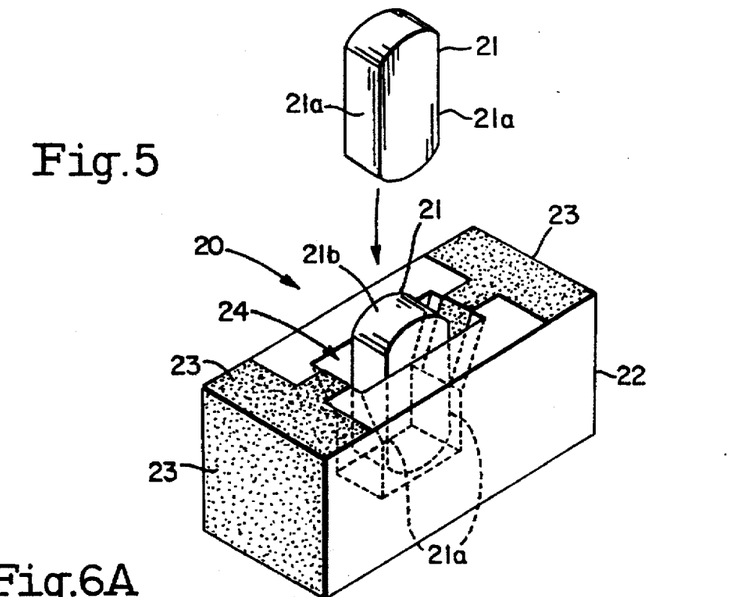
FIG. 5 is a perspective view illustrating a molded electric part as a fourth embodiment of the invention, which has a thermistor element received therein.

A molded thermistor is explained as a fourth embodiment according to the invention. FIG. 5 is a perspective view illustrating a molded electric part of the fourth embodiment of the invention, which has a thermistor element received therein as an exemplified element having a detection area. As illustrated in FIG. 5, a molded thermistor 20 includes a thermistor element 21 and an element-receiving body 22 having an element-receiving recess 24 formed therein for accommodating the thermistor element 21. Two electrodes 21a,21a formed on the thermistor element 21 are electrically connected to a film conductive pattern 23 formed on the surface of the element-receiving body 22 via solder. The element-receiving recess 24 is molded in an airtight manner with a sealing resin (not shown) to allow a detection area 21b of the thermistor element 21 to be exposed. Part of the conductive pattern 23 arranged on a bottom face of the element-receiving body 22 forms a film-shaped outside connection terminal, like the molded film capacitor of the first embodiment.

The molded thermistor of the fourth embodiment thus constructed is also free from untimely deterioration due to invasion of humidity and preferably applicable to surface mount technology.

In place of the thermistor element, other elements having a light-receiving area, such as photo diodes, photo transistors, and photoconductive cells, may be accommodated in the element-receiving body and molded with a sealing resin to form molded photo diodes molded photo transistors, and molded photoconductive cells in such a manner as to allow only the light-receiving area to be exposed outside. The principle of the invention is also applicable to sensors like proximity switches and photoelectric switches.

The outside connection terminal is formed on the bottom face of the element-receiving body in the above embodiments. Another possible structure does not have a conductive pattern on either the side faces or the bottom face of the element-receiving body. A conductive pattern formed only on the top face of the element-receiving body is specified as an outside connection terminal, which connects to a substrate. This structure does not have any conductive pattern exposed to outside, thereby being substantially free from effects due to a foreign noise. Such structure is especially preferable for high frequencies of not less than several hundreds megahertz. The outside connection terminal may also be set on the side faces of the element-receiving body according to the method of mounting the electric part.

The shape of the element-receiving recess can be varied suitably for the shape of the accommodated element. The numbers of conductive patterns and outside connection terminals may be determined according to the number of electrodes on the accommodated element.

Figure 6A:
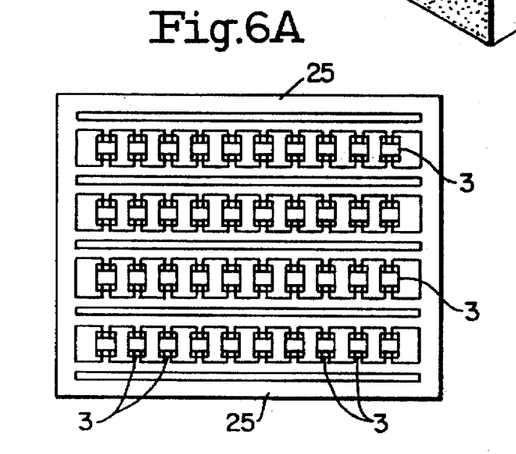
FIGS. 6A through 6C show a step of manufacturing a molded electric part embodying the invention.
Figure 6B:
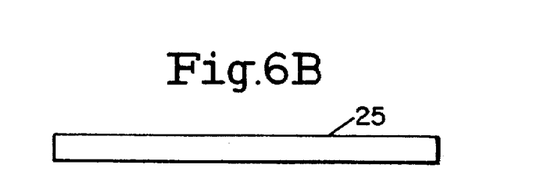
Figure 6C:
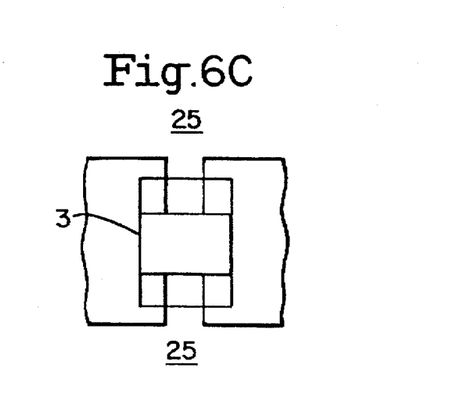
Figure 7:
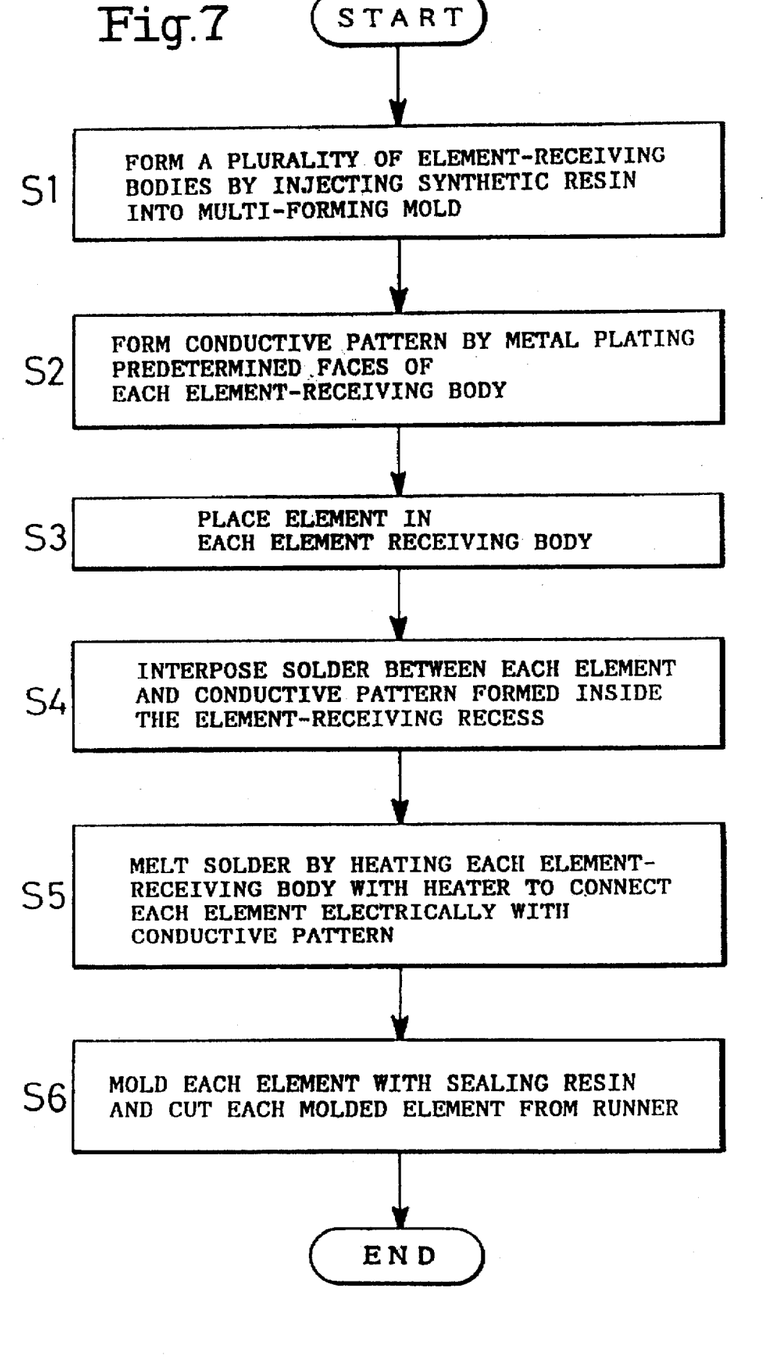
FIG. 7 is a flowchart showing a method of manufacturing a molded electric part embodying the invention.

A method of manufacturing a molded electric part according to the invention, a molded film capacitor as an example, is described according to the drawing of FIG. 6 and the flowchart of FIG. 7.

A multi-forming mold is prepared first, which includes a number of cavities arranged between runners 25 for molding element-receiving bodies with element-receiving recesses formed therein. A number of element-receiving bodies 3,3,3, . . . are simultaneously formed between the runners 25 by injecting a synthetic resin of high dielectric ability into the multi-forming mold as illustrated in FIG. 6A (step S1). A conductive pattern 4 and an outside connection terminal 8 are formed as shown in FIGS. 1 and 2 by plating a predetermined surface of each element-receiving body 3 with a metal (step S2). A film capacitor element 2 is then accommodated in the element-receiving recess 7 (see FIG. 1) of each element-receiving body 3 (step S3). Solder 5 is interposed between the conductive pattern 4 formed in each element-receiving recess 7 and electrodes 2a of the film capacitor element 2 as shown in FIG. 2B (step S4). Each element-receiving body 3 is placed in a heater (not shown), so that the solder 5 is molten to connect each film capacitor element 2 electrically to the conductive pattern 4 (step S5). Each film capacitor element 2 is molded with a sealing resin 6 (see FIG. 2B) and cut off the runner 25 with laser (step S6).

This method of manufacturing molded film capacitors does not require any time-consuming process as wire bonding and allows a number of molded elements to be manufactured simultaneously through a simple production step, thus favorably reducing the production cost. Injection molding gives products of fixed dimensions and stabilizes the floating capacity and inductance. The wire-free structure does not cause any disconnection and improves the production yield. This method has further advantage of no metal waste, compared with the conventional method giving metal waste due to blanking and cutting of lead frames.

The other molded electric parts described in the above embodiments are manufactured in the same manner as that for the molded film capacitor. The element having a specific electrode arrangement may, however, be connected with the conductive pattern by wire bonding technique.

The conductive pattern is preferably formed according to the following method. A primary portion of an element-receiving body including a surface, on which a conductive pattern is formed, is injection-molded with a thermoplastic resin having favorable plate adhesion. A secondary portion of the element-receiving body which does not include the surface for a conductive pattern is integrally formed of a thermoplastic resin having poor plate adhesion over the primary portion. Plating the whole body results in plating only the surface of the primary portion and forming a conductive pattern on the surface.

In an alternative method, the whole element-receiving body is injection-molded with a thermoplastic resin having good plate adhesion, and the whole surface is processed by etching, catalytic process, or electroless copper plating. After the whole surface is masked with an etching resist, a part for forming a conductive pattern is imaged. A conductive pattern is formed in the imaged part by plating and copper etching after peeling off the masking resist.

A typical example of the thermoplastic resin used in either of the above manufacturing methods is liquid crystal polymers (LCP). The liquid crystal polymer acquires, through injection molding, preferable characteristics as a high degree of orientation and sufficient molecular rigidity, thus forming element-receiving bodies having preferably high strength, elasticity, and size stability and excellent heat and chemical resistance.

Liquid-crystal polyester resins are especially preferred among various liquid-crystal polymers having the above characteristics. A most preferable example is copolyester of p-hydroxybenzoic acid and 6-oxy-2-naphtoic acid, which has a relatively low melting point (280° to 310° C.), high injection moldability, and preferable flow properties for formation of fine, narrow conductive patterns. While having a low melting point, the copolyester has excellent solder heat resistance (10 seconds at 260° C. through 30 seconds at 280° C.) suitable for packaging the molded electric part. The copolymer has a significantly low dielectric dissipation factor or dielectric loss factor in a high-frequency band of $10^{10}$ Hz, and is thereby not easily affected by foreign noise but suitable as a material of molded electric parts.

The liquid-crystal polyester resins having the above characteristics include those of preferable plate adhesion and those of low plate adhesion according to the resin composition. Application of the different types of the liquid-crystal polyester resins to the first method described above allows element-receiving bodies to be easily molded. These liquid-crystal polyester resins having different plate adhesion are chemically homogeneous and have high interfacial affinity, thus improving adhesion of the primary part to the secondly part.

The invention is not restricted to the above embodiments, but there may be many modifications, alterations, and changes without departing from the scope or spirit of the essential characteristics of the invention. For example, the invention is applicable to electric parts without being molded with a sealing resin.

As described above in detail, the molded electric part of the invention has a wire-free structure, which allows downsizing and weight reduction of the whole electric part and effectively prevents humidity from entering through projections of lead wires and deteriorating the electric part. Injection molding gives products of fixed dimensions and stabilizes the floating capacity and inductance, thus producing electric parts with excellent electrical properties. A conductive pattern formed on the side faces and the top face of the element-receiving body can be used as an outside connection terminal. This allows the electric part to be mounted at a desirable orientation. Contact of the outside connection terminal at planes does not require strictly precise positioning. The method of manufacturing the molded electric part according to the invention allows a number of electric parts to be manufactured simultaneously and easily with a multiforming mold while not requiring an additional process of piercing through holes for lead wires in a substrate. The method of the invention effectively shortens the manufacturing process and improves the production yield.

What is claimed is:

1. An electric part comprising an element having an electrode, an element-receiving body primarily composed of synthetic resin with high dielectric ability, said element-receiving body having an element-receiving recess formed in a predetermined site of said element-receiving body for accommodating said element therein, a conductive pattern formed by plating on a portion surface of said element-receiving body, and an outside-connection terminal formed on a part of said portion surface of said element-receiving body, wherein said electrode of said element is electrically connected to said outside-connection terminal via said conductive pattern.

2. An electric part in accordance with claim 1, further comprising a sealing resin for molding said element accommodated in said element-receiving recess.

3. An electric part in accordance with claim 1, wherein said element comprises a 2-terminal element.

4. An electric part in accordance with claim 1, wherein said element comprises a 3-terminal element.

5. An electric part in accordance with claim 1, wherein said element comprises a 2-terminal columnar element.

6. An electric part in accordance with claim 1, wherein said element comprises an element having a detection area.

7. An electric part in accordance with claim 1, wherein said electric part is free of lead wires.

8. An electric part in accordance with claim 1, wherein a part of said conductive pattern forms said outside-connection terminal.

9. An electric part in accordance with claim 1, wherein said outside-connection terminal is disposed on a bottom face of said element-receiving body.

10. An electric part in accordance with claim 1, wherein said outside-connection terminal is disposed on a top face of said element-receiving body.

11. An electric part in accordance with claim 3, wherein said 2-terminal element comprises a film capacitor element having two electrodes, said two electrodes of said film capacitor element being electrically connected to said conductive pattern.

12. An electric part in accordance with claim 4, wherein said 3-terminal element comprises a transistor element having three electrodes, said three electrodes of said transistor element being electrically connected to said conductive pattern.

13. An electric part in accordance with claim 5, wherein said 2-terminal columnar element comprises a resistor element having two electrodes, said two electrodes of said resistor element being electrically connected to said conductive pattern.

14. An electric part in accordance with claim 6, wherein said element having the detection area comprises a thermistor element having two electrodes, said two electrodes of said thermistor element being electrically connected to said conductive pattern.

15. A molded electric part comprising an element having an electrode, an element-receiving body primarily composed of a synthetic resin with high dielectric ability, said element-receiving body having an element receiving recess formed in a predetermined site of said element-receiving body for accommodating said element therein, a conductive pattern formed by plating on a portion surface of said element-receiving body, an outside-connection terminal formed on a part of said portion surface of said element-receiving body, and a sealing resin for molding said element accommodated in said element-receiving recess, wherein said electrode of said element is electrically connected to said outside-connection terminal via said conductive pattern.

16. A molded electric part in accordance with claim 15, wherein said element comprises a 2-terminal element.

17. A molded electric part in accordance with claim 15, wherein said element comprises a 3-terminal element.

18. A molded electric part in accordance with claim 15, wherein said element comprises a 2-terminal columnar element.

19. A molded electric part in accordance with claim 15, wherein said element comprises an element having a detection area.

20. A molded electric part in accordance with claim 15, wherein said molded electric part is free of lead wires.

21. A molded electric part in accordance with claim 15, wherein a part of said conductive pattern forms said outside-connection terminal.

22. A molded electric part in accordance with claim 15, wherein said outside-connection terminal is disposed on a bottom face of said element-receiving body.

23. A molded electric part in accordance with claim 15, wherein said outside-connection terminal is disposed on a top face of said element-receiving body.

24. A molded electric part in accordance with claim 16, wherein said 2-terminal element comprises a film capacitor element having two electrodes, said two electrodes of said film capacitor element being electrically connected to said conductive pattern.

25. A molded electric part in accordance with claim 17, wherein said 3-terminal element comprises a transistor element having three electrodes, said three electrodes of said transistor element being electrically connected to said conductive pattern.

26. A molded electric part in accordance with claim 18, wherein said 2-terminal columnar element comprises a resistor element having two electrodes, said two electrodes of said resistor element being electrically connected to said conductive pattern.

27. A molded electric part in accordance with claim 19, wherein said element having the detection area comprises a thermistor element having two electrodes, said two electrodes of said thermistor element being electrically connected to said conductive pattern.

* * * * *